United States Patent [19]

James et al.

[11] Patent Number: 5,047,730

[45] Date of Patent: Sep. 10, 1991

[54] OPERATIONAL AMPLIFIER HAVING STABLE BIAS CURRENT PROVIDING MEANS

[75] Inventors: Felicia M. James, Carrollton, Tex.; Peter J. Andrews, Raunds, England

[73] Assignee: Texas Instruments Incorporated, Dallas, Tex.

[21] Appl. No.: 581,335

[22] Filed: Sep. 12, 1990

Related U.S. Application Data

[62] Division of Ser. No. 330,402, Mar. 29, 1989, Pat. No. 4,975,632.

[51] Int. Cl.$^5$ .................... H03F 3/45

[52] U.S. Cl. .................... 330/256; 330/257; 330/261; 330/289

[58] Field of Search .............. 330/256, 257, 261, 289

[56] References Cited

U.S. PATENT DOCUMENTS 4,323,854 4/1982 Hester .................... 330/256

*Primary Examiner*—James B. Mullins

*Attorney, Agent, or Firm*—W. James Brady, III; Melvin Sharp; Stanton C. Braden

[57] ABSTRACT

A bias current supply circuit (20) is provided which includes an initial current source comprising a FET (22) coupled to a current mirror circuit comprising a pair of BJTs (26 and 28). An active resistive element comprising a second FET (24) is included to stabilize an output current $I_0$ with respect to ambient temperature variations and process variations.

6 Claims, 3 Drawing Sheets

OPERATIONAL AMPLIFIER HAVING STABLE BIAS CURRENT PROVIDING MEANS

This is a division of application Ser. No. 330,402, filed Mar. 29, 1989, now U.S. Pat. No. 4,975,632.

TECHNICAL FIELD OF THE INVENTION

This invention relates in general to the field of integrated electronic devices. More particularly, the present invention relates to a method and apparatus for providing a stable bias current to an integrated circuit device.

BACKGROUND OF THE INVENTION

A variety of integrated circuit devices require the generation of a stable bias current by a portion of the device. The bias current is used to set the magnitude of the currents used to power the various components of the device. It is very important that the bias current remain as near as possible to a predetermined level to insure that the total current required by the integrated circuit device is constant and therefore predictable.

A variety of forces acting upon the integrated circuit device can create fluctuations in the bias current level. The two most significant forces are the ambient temperature in which the device is operating, which causes bias current fluctuations, and the variations which are introduced in the device during the construction of the device, which affect the magnitude of the bias current.

A typical example of an integrated circuit device which needs a stable bias current supply is a low-power operational amplifier. Because these amplifiers are used in low-power situations, these devices require relatively simple bias circuits with few components and minimal current requirements. Bias current supply circuits for high precision operational amplifiers tend to include a large number of components in order to provide a stable output current. However, these circuits require more current than would be acceptable for a low-power design.

Simpler bias current supply circuits in use with low-power designs consume less current, but they are more susceptible to process variations and ambient temperature changes. As a result, the performance of the low-power operation amplifier suffers. Hence, bias current supply circuits presently in use meet the requirement of simple design with low current requirements. While these circuits normally include rudimentary temperature compensation through the use of conventional resistors, they provide no protection against process variations. Additionally, due to the fact that process variations in resistors are particularly difficult to control, the addition of these resistors to conventional bias current supply circuits augments the problem of process variations.

Therefore, a need has arisen for a simple bias current supply circuit using a relatively small number of components and having correspondingly small current requirements which can provide an output current that is stable with respect to both ambient temperature variations and process variations.

SUMMARY OF THE INVENTION

In accordance with the teachings of the present invention, a low-power bias current supply circuit is provided which substantially eliminates or reduces disadvantages and problems associated with prior art circuits. More specifically, the present invention provides a low-power bias current supply circuit which can be used to supply a stable bias current to a variety of integrated circuit devices. The circuit of the present invention exhibits greater stability in its output current level than prior art circuits with respect to ambient temperature variations and process variations.

In one embodiment of the present invention, an initial current source is coupled to a current mirror. The current mirror includes an active resistive element comprising a transistor. Forces which vary the output current of the initial current source are partially counteracted by the active resistive element. The low-power bias circuit of the present invention therefore exhibits greater stability with respect to ambient temperature variations and process variations.

In another embodiment of the invention, a low-power differential amplifier circuit is provided which includes a stable bias current supply circuit. The bias current supply circuit includes an initial current source and a current mirror. Within the current mirror, a junction field effect transistor is included as an active resistive element to provide stability in the output current of the bias circuit with respect to ambient temperature and process variations. Because of the added stability to the output current of the bias current supply circuit, the low power differential amplifier circuit exhibits smaller variations in its total current supply needs.

An important technical advantage of the present invention is that it provides for a stable bias current supply with a small number of components. Stability is provided against both process and ambient temperature variations without the large current requirements of more complex stabilizing schemes.

A further technical advantage of the present invention is that it provides stabilization of the bias current supply without using conventional resistors. Process variations in conventional resistors are extremely difficult to control and may further complicate any stabilization scheme. A circuit constructed in accordance with the present invention does not require conventional resistors, and thus avoids these wide process variations.

BRIEF DESCRIPTION OF THE DRAWINGS

A more complete understanding of the present invention may be acquired by referring to the Detailed Description of the invention and claims when considered in 5 connection with the accompanying drawings in which like reference numbers indicate like features, wherein:

DETAILED DESCRIPTION OF THE INVENTION

Figure 1:
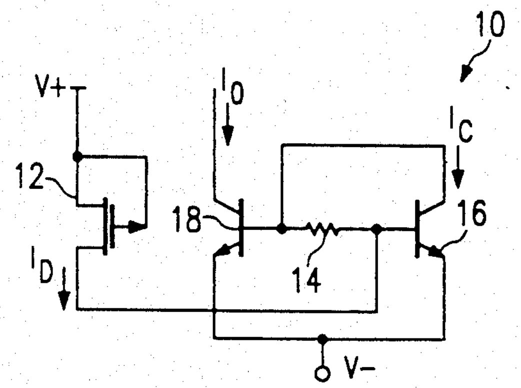
FIG. 1 (PRIOR ART)
FIG. 1 is a schematic representation of a prior art bias current supply circuit.

FIG. 1 is a schematic representation of a typical prior art bias current supply circuit, indicated generally at 10. Circuit 10 comprises a first junction field effect transistor (JFET) 12. A source and a gate of JFET 12 are coupled to a voltage source V+. An initial current $I_D$ is shown on FIG. 1 to be generated from the drain of JFET 12. The drain of JFET 12 is coupled to one end of a resistor 14 and to the base of a first bipolar junction transistor (BJT) 16. The opposite end of resistor 14 is coupled to the collector of BJT 16. The emitter of BJT 16 is coupled to a voltage source V−. The collector of BJT 16 is also coupled to the base of a second BJT 18. The emitter of BJT 18 is coupled to voltage source V−. An output current $I_O$ is generated in the collector of BJT 18.

Figure 2:
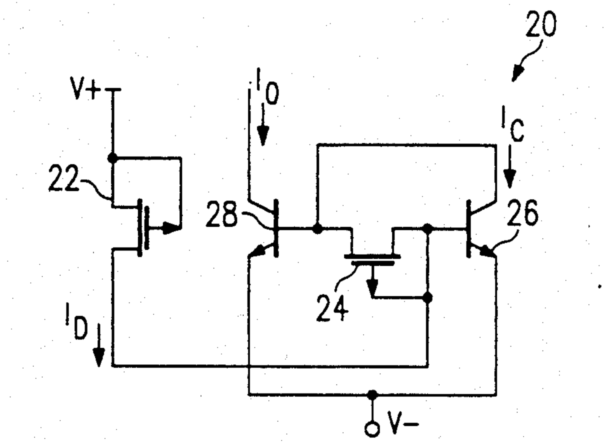
FIG. 2 is a schematic representation of a bias current supply circuit constructed according to the present invention.

A schematic representation of a bias current supply circuit constructed according to the present invention is indicated generally at 20 in FIG. 2. Circuit 20 comprises a first FET 22 which has its gate and source coupled to a voltage supply V+. FET 22 generates an initial current $I_D$ in its drain. The drain of first FET 22 is coupled to the gate and the source of a second FET 24 as well as to the base of a BJT 26. The drain of FET 24 is coupled to the collector of BJT 26, and to the base of a BJT 28. The emitter of BJT 26 is coupled to the emitter of BJT 28 and to a voltage supply V−. An output current $I_O$ is generated by circuit 20 in the collector of BJT 28.

In the preferred embodiment, FETs 22 and 24 comprise p-channel JFETs. However, a similar circuit could be designed using n-channel JFETs or n-channel or p-channel depletion mode MOSFETs.

By calculating the value of $I_O$ as a function of the device parameters in each circuit, important technical 5 advantages of circuit 20 can be demonstrated. For both circuit 10 and circuit 20, some simplifying assumptions can be made. First, all base currents will be assumed to be negligible. Second, BJT's 16, 18, 26 and 28 will be assumed to be equivalent transistors. In other words, the 0 saturation currents and areas for each of these transistors will be assumed to be equal. With these reasonable assumptions, the following equations can be derived for both circuits 10 and 20:

$$I_D = I_C \quad (1)$$

where $I_C$ is defined as the current flowing in the collector of *BJT* 16 and *BJT* 26 as shown in FIGS. 1 and 2.

$$I_O = I_D(\exp[-(I_D R_{eq})/V_t]) \quad (2)$$

where $V_t = kT/q$ where $k$ = Boltzmann constant = 1.381E-23 Joules/K $q$ = 1.6019E-19 Coulombs For circuit 10, $R_{eq}$ equals the value of resistor 14. For circuit 12, $R_{eq}$ is defined as the source drain voltage across FET 24 divided by the current through FET 24. This can be written as:

$$R_{eq} = V_{DS}/I_D$$

Equation 2, shown above, is derived by summing the voltages around the loop. The equation for the output current can then be derived as follows:

<u>Derivation</u>

$$V_{BE18\ or\ 28} = V_{BE16\ or\ 26} + (-I_c)R_{eq}$$

$$V_t \ln\frac{I_o}{I_s A} = V_t \ln\frac{I_c}{I_s A} + (-I_c)R_{eq}$$

$$= V_t \ln\frac{I_D}{I_s A} + (-I_D)R_{eq}$$

$$V_t \ln\frac{I_o}{I_s A}\,\frac{I_s A}{I_D} = -I_D R_{eq}$$

$$V_t \ln\frac{I_o}{I_D} = -I_D R_{eq}$$

$$\frac{I_o}{I_D} = \exp\frac{-I_D R_{eq}}{V_t}$$

$$I_o = I_D \exp\frac{-I_D R_{eq}}{V_t}$$

where A is the area of the BJT's 12, 16, 26 and 28 and $I_s$ is a constant representing the saturation current for each of these transistors.

In order to better demonstrate the advantages of circuit 20 over circuit 10, mathematical terms may be added to equation 2 to illustrate process variations in all of the process dependent terms. For circuit 10 shown in FIG. 1, this results in the following equation:

$$(P_1 I_O) = (P_2 I_D)\exp[-[(P_2 I_D)(P_3 R)]/V_t] \quad (3)$$

where $P_1$, $P_2$ and $P_3$ are percentile factors. These factors represent the fractional level of a particular parameter with respect to an optimum level for that parameter. In other words, a value of 0.90 for $P_3$ would indicate that due to below optimum processing, the value of resistor 14 is only ninety percent of its optimum value. If equation 2 is applied to circuit 20 shown in FIG. 2, and similar process terms are added, the following equation can be derived:

$$(P_4 I_O) = (P_2 I_D)\exp[-[(P_2 I_D)(P_5 V_{DS})/(P_2 I_D)]/V_t \quad (4)$$

$$= (P_2 I_D)\exp[-(P_5 I_D)R_{eq}]/V_t]$$

When conventional process techniques are used to construct circuits 10 and 20, the value of a standard base resistor can vary by as much as twenty five percent above or below its optimum value. In addition, the value of the saturation current for a JFET can also vary by as much as twenty five percent above or below its optimum value. Thus, these variations are also included in the equations which have been derived.

To determine the variation in $V_{DS}$ for a twenty five percent change in $I_D$, the equation for a JFET operating in the linear region is used. This equation is as follows:

$$I_D = Area \times \beta \times V_{DS}[2(V_{GS} - V_{TO}) - V_{DS}][1 + \lambda \times V_{DS}] \quad (5)$$

λ can be neglected in equation 5 because JFET 24 has a very small drain to source voltage. Solving equation 5 for $V_{DS}$ results in the following equation:

$$V_{DS}=V_P-SQRT[V_P^2-I_D/(Area\times\beta)] \quad (6)$$

where Area is defined as the width divided by the length of the channel region of JFET 24 and $V_P$ and $\beta$ are other device parameters of JFET 24.

By substituting in the characteristic data for JFET 24 into equation 6, it can be determined that if $I_D$ is at seventy-five percent of its nominal value, $V_{DS}$ is at eighty percent of its nominal value.

To illustrate the difference between the two circuits, $I_D$ will be assumed to be seventy five percent of its nominal value. For this example, the following conditions will be assumed:

Assumptions $I_D=14\ \mu A$ $Req=R=1700$ ohms $V_t=0.0258$ V $I_O=5.56\ \mu A$

By substituting these values into equation 3 for circuit 10 and assuming the base resistor 14 is at seventy five percent of its nominal value, the following value for the process error attributable to the output current can be derived.

$$\begin{aligned} P2 &= [(0.75\times I_D)/I_O]\times\exp[-(0.75\times I_D\times 0.75\times R)/V_t] \quad (7)\\ &= [(0.75\times I_D)/I_O]\times\exp[-(0.5625\times I_D\times R)/V_t]\\ &= 0.75 \end{aligned}$$

By performing a similar calculation using equation (4) derived from circuit 20, the following value for the variance in the output current due to process variations can be derived as follows:

$$\begin{aligned} P2 &= [(0.75\times I_D)/I_O]\times\exp[-(0.75\times I_D\times(0.8/0.75)\times R_{eq})/V_t] \quad (8)\\ &= [(0.75\times I_D)/I_O]\times\exp[-(0.8\times I_D\times Req)/V_t]\\ &= 0.90 \end{aligned}$$

This example demonstrates that under the worst possible process variations, the output current of circuit 10 will change twenty-five percent, while the output current of circuit 20 shown in FIG. 2 will only change ten percent.

The superior performance of circuit 20 results from the fact that FET 24 is constructed to be similar to FET 22. These devices, for example, may be constructed near each other on an integrated circuit chip such that they will exhibit near identical process variations and be subject to similar temperature variations. Because of the matched nature of FETs 22 and 24, any variance in the initial current $I_D$ caused by forces acting on FET 22 is counteracted by FET 24 which has the same variance causing forces acting upon it.

In the layout of FET 24, the source and drain resistances should be minimized. This can be accomplished by providing relative short source and drain diffusions and by contacting the source and drain in more than one location.

Figure 3A:
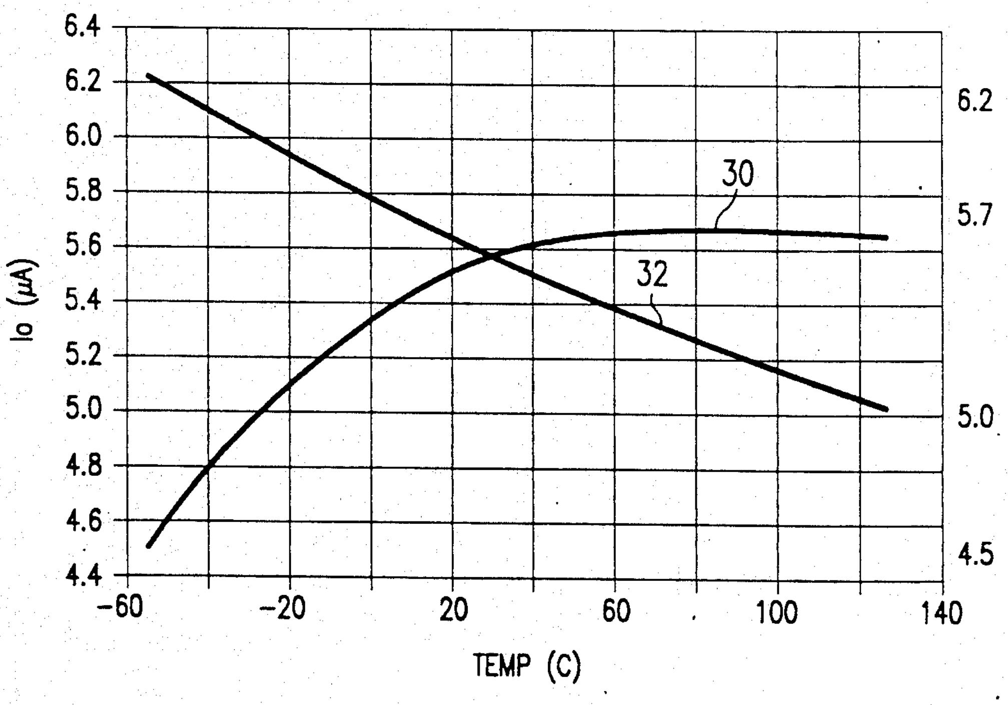
FIG. 3*a* is a graphical representation of the performance of a prior art bias current supply circuit and a bias current supply circuit constructed according to the present invention at nominal process values with respect to ambient temperature variations.

Referring now to FIG. 3*a*, a graphical representation of the performance of circuit 10 and circuit 20 is shown. Temperature in degrees Celsius is shown on the ordinate axis of the graph in FIG. 3*a*, while the output current $I_O$ is shown in microamps on the coordinate axis. A curve 30 illustrates the performance of the circuit 10 under nominal process conditions and under variable ambient temperature conditions. A curve 32 illustrates the performance of circuit 20 under nominal process conditions and variable ambient temperature conditions.

Although under nominal conditions, the percentage variations of the performances of the two circuits is similar, circuit 20 of the present invention provides several distinct advantages. The change in output current as ambient temperature varies, is fairly linear for circuit 20 as is demonstrated by the curve 32. Such a linear variation with respect to temperature is much easier to compensate for than the nonlinear variations associated with circuit 10 shown by curve 30.

A further technical advantage of circuit 20 is that it has a negative temperature coefficient. If circuit 20 is used with a circuit that has a slightly positive temperature coefficient, the decrease in current supplied by circuit 20 with increasing temperature helps minimize the change in total supply current of the subject circuit as temperature varies.

Figure 3B:
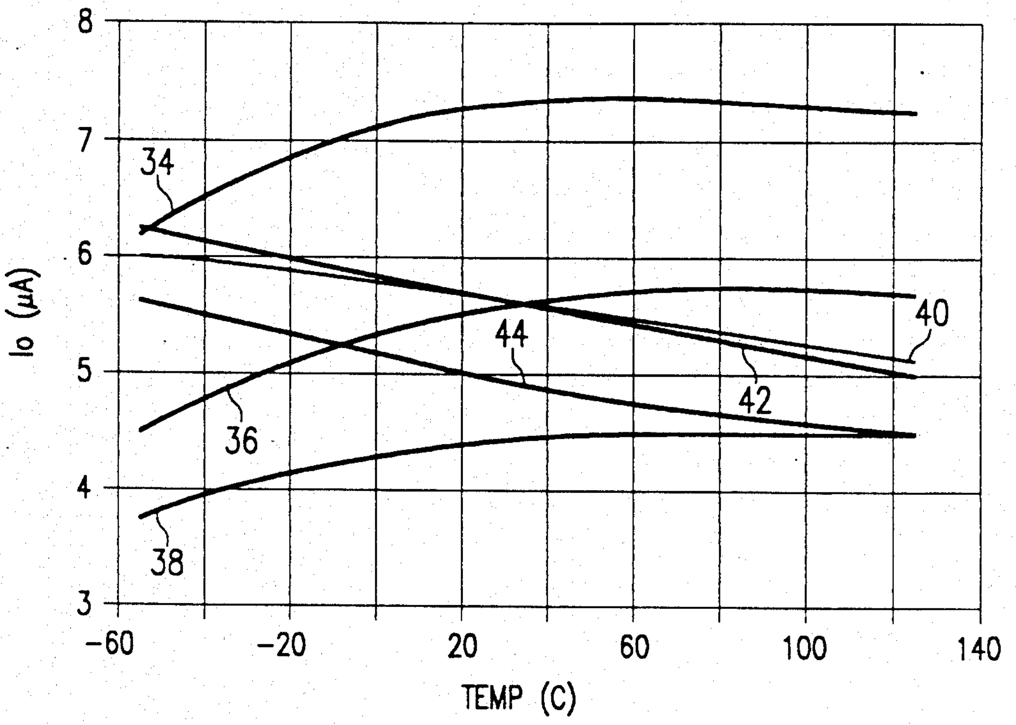
FIG. 3*b* is a graphical representation of the performance of a prior art bias current supply circuit and a bias current supply circuit constructed according to the present invention with respect to both ambient temperature and process variations.

FIG. 3*b* is a graphical representation of the performance of circuit 10 and 20 with respect to both ambient temperature variations and process variations. A curve 36 and a curve 42 illustrate the performances which were shown on FIG. 3*a* of circuits 10 and 20, respectively, under nominal process conditions and under varying ambient temperatures. A curve 34 illustrates the performance of circuit 10 under varying ambient temperatures with JFET 12 within circuit 10 having a value of twenty five percent greater than nominal, and resistor 14 having a value twenty five percent less than nominal. As discussed previously, process variations of ± twenty five percent are possible using current processing technology. Because of the configuration of the components of circuit 10, the two worst case scenarios for variations in the output current $I_O$ occur when JFET 12 and resistor 14 are at opposite ends of the possible process variation spectrums.

Curve 38 represents the opposite worst case scenario for circuit 10 due to process variations. Curve 38 illustrates the performance of circuit 10 under varying ambient temperatures when JFET 12 is twenty five percent less than nominal and resistor 14 is twenty five percent greater than its nominal value. Curves 34 and 38 therefore represent the possible extremes of performance of circuit 10 due to process variations and ambient temperature variations. The actual performance of circuit 10 will therefore be within the envelope created by curves 34 and 38.

A curve 42 shown in FIG. 3*b* represents the performance of circuit 20 over ambient temperature variations under nominal process conditions. The possible worst cases for circuit 20 occur when the operational parameters for both JFET 22 and JFET 24 are twenty-five percent higher than their nominal values, and when these parameters for both JFETs 22 and 24 are twenty-five percent lower than their nominal values. The process variations for JFETs 22 and 2 are normally not independent. JFETs 22 and 24 may be placed in a circuit layout such that they will exhibit nearly identical process variations. Thus, it is not necessary to consider the scenario where JFET 22 exhibits a different process variation than JFET 24. A curve 40 illustrates the performance of circuit 20 under varying ambient temperature conditions when the operational parameters of both JFETs 22 and 24 are twenty-five percent higher than their nominal values. A curve 44 illustrates the performance of circuit 20 under varying ambient temperature conditions when the operational parameters for both JFETs 22 and 24 are twenty-five percent less than their nominal values due to process variations.

The envelope created by curves 40 and 44 of possible output current performance for circuit 20 is clearly narrower than that shown on FIG. 3*b* for circuit 10. FIG. 3*b* therefore illustrates the important technical advantage that circuit 20 has over circuit 10 through its stability over both temperature and process variations.

Figure 4:
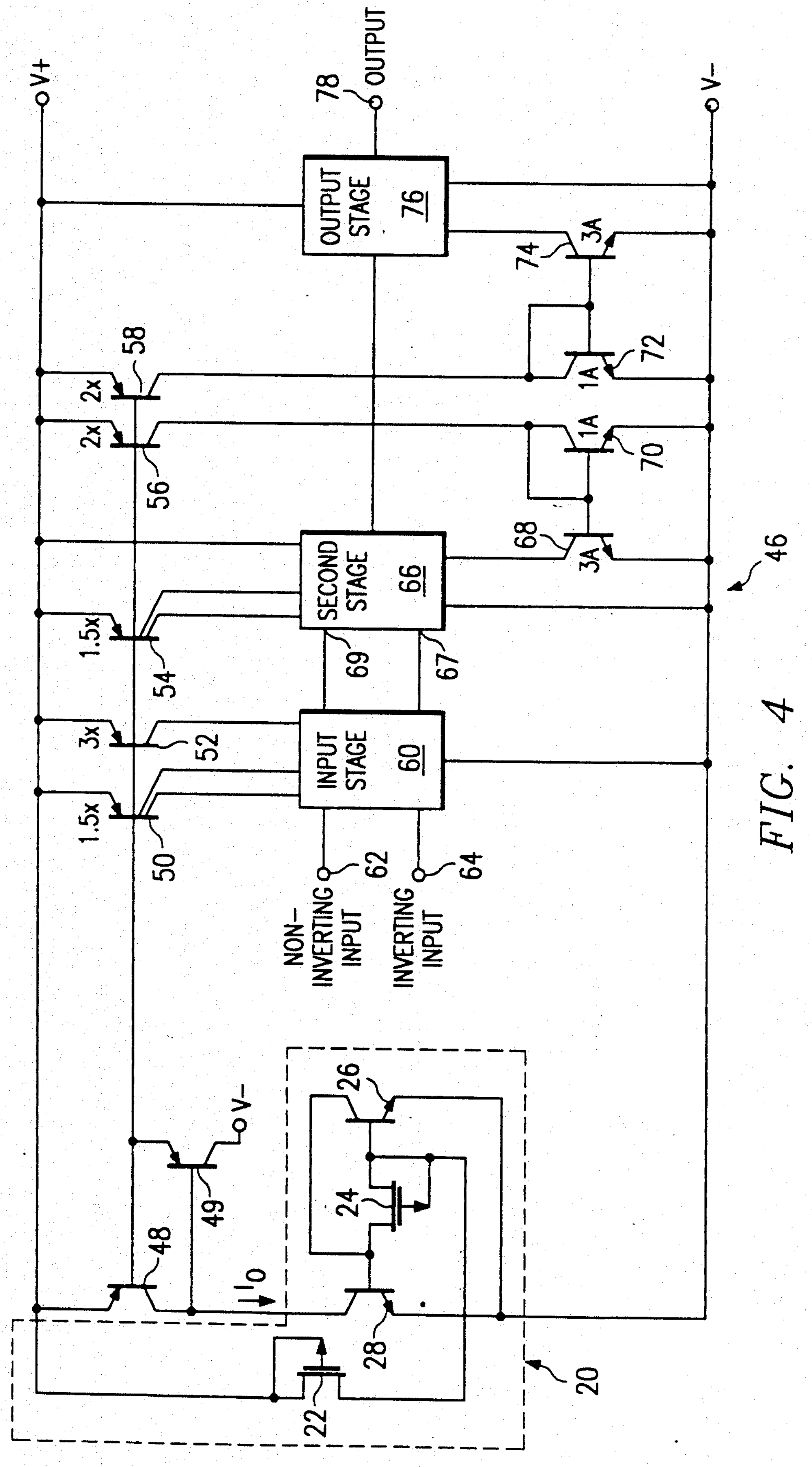
FIG. 4 is a schematic diagram of an operational amplifier constructed according to the present invention.

A further embodiment of the present invention is illustrated in FIG. 4. The importance of the stability of the output current $I_O$ of circuit 20 is best illustrated when the bias circuit 20 is examined in conjunction with a particular circuit for which it is supplying bias current. FIG. 4 is a schematic diagram of a differential amplifier 46 using circuit 20 to supply the bias current for the various stages of the amplifier.

The bias circuit 20 supplies the biasing output current $I_O$ which is driven through a BJT 48. BJT 48 has its collector coupled to the collector of BJT 28 within bias circuit 20 and its emitter coupled to the V+ voltage source. BJT 48 functions as a portion of a current mirror which controls the amount of current input into each of the stages of op amp 46. BJT 49 has a base connected to the collector of BJT 48, an emitter connected to the base of BJT 48, and a collector connected to the V− voltage supply. This current mirror comprises BJT 48, a BJT 50, a BJT 52, a BJT 54, a BJT 56 and a BJT 58. BJT 49 supplies the base current for BJTs 48 and 50–58.

Each of the BJTs 50 through 58 are sized in proportion to BJT 48 as shown in FIG. 4. For example, as illustrated in FIG. 4, BJT 50 is 1.5 times the size of BJT 48. BJT 50 and 52 each have their bases coupled to the base of BJT 48. Both BJT 50 and 52 have their emitters coupled to the V+ voltage supply. BJT 50 has two collector outputs which are coupled to an input stage 60. BJT 52 has a single collector output coupled to input stage 60. Input stage 60 has a non-inverting input 62 and an inverting input 64. A signal input on non-inverting input 62 is amplified by amplifier 46 without inverting the signal. A signal input on inverting input 64 is amplified by amplifier 46 and is also inverted prior to output Input stage 60 is also coupled to the V− voltage supply.

BJT 54 has its base coupled to BJT 48 and its emitter coupled to the V+ voltage supply. BJT 54 has two collector outputs which are coupled to a second stage 66. BJT 54 is 1.5 times the size of BJT 48 and therefore conducts approximately 1.5 times the current as BJT 48. Second stage 66 is coupled directly to the V+ voltage supply. Second stage 66 is also coupled through an inverting input 67 and a noninverting input 69 to input stage 60. Second stage 66 is coupled directly to the V− voltage supply and is also coupled to the collector of an npn BJT 68. The emitter of BJT 68 is coupled to the V− voltage supply. The base of BJT 68 is coupled to an npn BJT 70. The emitter of BJT 70 is coupled to the V− voltage supply. The collector and base of BJT 70 are coupled to the collector of BJT 56. The emitter of BJT 56 is coupled to the V+ voltage supply. The base of BJT 56 is coupled to the base of BJT 48.

BJT 58 has its emitter coupled to the V+ voltage supply, its base coupled to the base of BJT 48 and its collector coupled to the base and collector of an npn BJT 72. BJT 72 has its emitter coupled to the V− voltage supply. The base and collector of BJT 72 are coupled to the base of an npn BJT 74. The emitter of BJT 74 is coupled to the V− voltage supply, and the collector of BJT 74 is coupled to an output stage 76.

Output stage 76 is coupled directly to second stage 66, the V+ voltage supply and the V− voltage supply. Output stage 76 generates the output signal of the amplifier 46 through an output node 78.

Npn BJTs 68, 70, 72 and 74 are shown to be sized independently of the pnp BJTs 48, 50, 52, 54, 56 and 58. The ratio of the sizes of the npn BJTs is independent of the ratio of the sizes of pnp BJTs. The current in npn BJT 70 and in npn BJT 72 is set by pnp BJTs 56 and 58, respectively. This current is set through the current mirror formed by BJTs 48, 56 and 58 at two times the output current $I_O$ of bias circuit 20. The current flowing through BJT 68 is thereby set through the operation of a current mirror at three times the current flowing through npn BJT 70. The current flowing through npn BJT 68 is therefore approximately six times the output current $I_O$ of bias circuit 20. Similarly, the current flowing through npn BJT 74 is approximately six times the output current $I_O$ generated by circuit 20.

In operation, the currents flowing in every stage of amplifier 46 are substantially proportional to the output current $I_O$ generated by bias circuit 20. Thus, any variation in the output current $I_O$ is geometrically augmented and can make dramatic changes in the total current requirements of amplifier 46. Due to these geometric relationships of the supply currents to the various stages of amplifier 46, a small variation in the output current $I_O$ is multiplied approximately 36 times in the total supply current of amplifier 46.

Figure 5:
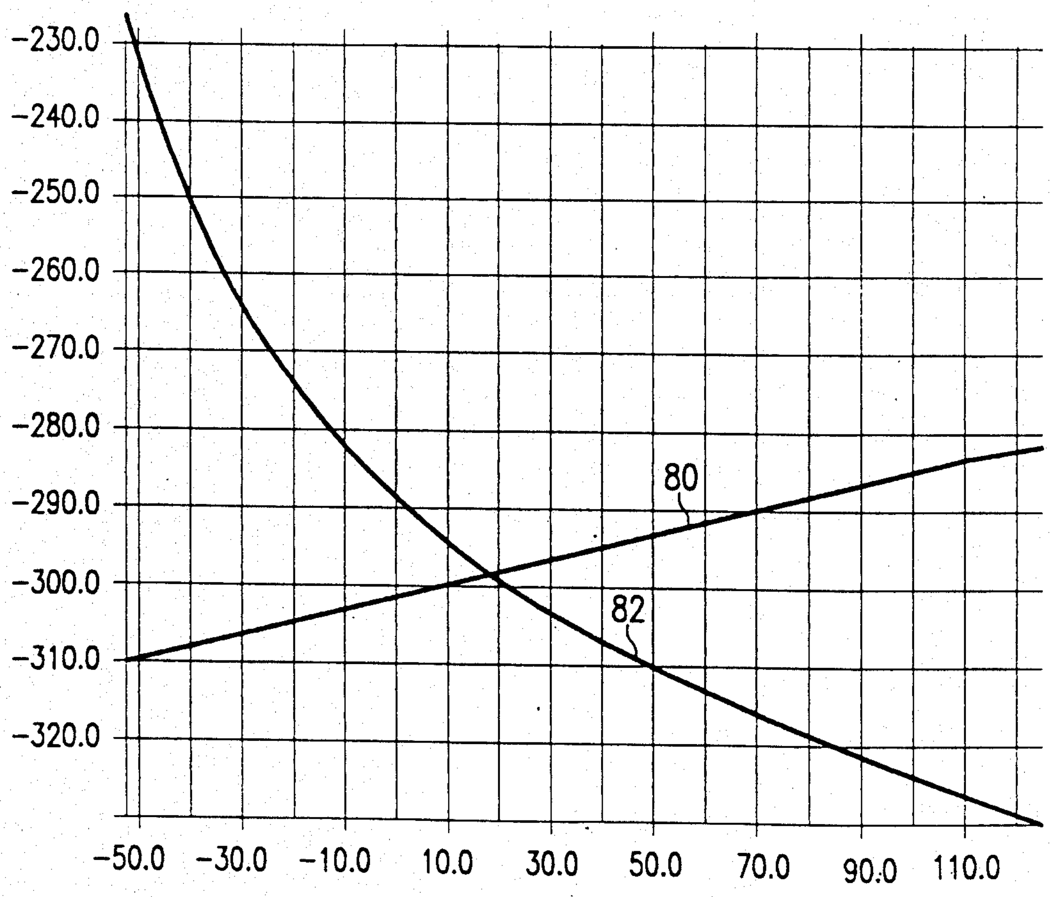
FIG. 5 is a graphical comparison of the total current requirements of a prior art operational amplifier and an operational amplifier constructed according to the present invention with respect to ambient temperature variations.

FIG. 5 graphically illustrates the improved performance of circuit 20 over circuit 10 when used in amplifier 46. FIG. 5 is a graphical representation of the total supply current to amplifier 46 as ambient temperature is varied. A curve 82 illustrates the variations in total supply current over a range of ambient temperatures for an amplifier similar to amplifier 46, but using circuit 10 shown in FIG. 1 as the bias current supply circuit. A curve 80 illustrates the performance of amplifier 46 using circuit 20 as the bias current supply circuit. Over the 170° range shown in FIG. 5, curve 82 shows a ninety microamp variation in total supply current. Curve 80, however, over the same temperature range, illustrates only a thirty microamp variation in total supply current.

FIG. 5 also illustrates that curve 80 is much more linear than curve 82. This fact illustrates that the temperature dependence of the total supply current of an operational amplifier using a bias current supply circuit constructed according to the present invention has an approximately linear temperature dependence. As discussed previously, the linear temperature dependence of curve 80 is much simpler to design for than the nonlinear temperature dependence shown in curve 82.

The bias current supply circuit 20 shown in FIGS. 2 and 4 is applicable to a wide variety of circuits. The amplifier 46 illustrated in FIG. 4 is only one possible embodiment of the present invention and has been used solely for the purposes of teaching important technical advantages of the present invention. A current supply circuit constructed according to the present invention may be used wherever a current is required which must remain constant in the face of ambient temperature and process variations.

In summary, a current supply circuit is provided which exhibits marked improvement in supplying a constant current level in the face of ambient temperature variations and process variations. The current supply circuit provided requires relatively few components and thus is capable of operating in extremely low-power circuit contexts.

The foregoing description uses preferred embodiments to illustrate the present invention. However, changes and modifications may be made in these embodiments without department from the scope and spirit of the present invention, which are defined solely by the claims that follow.

What is claimed is:

1. An operational amplifier circuit, comprising:

a bias current supply circuit, comprising:

an initial current source, an initial current output by said initial current source varying in magnitude due to effects of variance inducing factors;

a current mirror circuit coupled to said initial current source and responsive to said initial current and outputting a bias current; and an active resistive element within said current mirror circuit comprising a transistor, said transistor responsive to said initial current and the variance inducing factors and operable to counteract the variance of said initial current and thus minimize variance in said bias current;

a second current mirror circuit coupled to said bias current supply circuit and responsive to said bias current to supply current to a plurality of stages within the operational amplifier circuit;

an input stage coupled to said second current mirror circuit operable to receive an input signal to be amplified by the operational amplifier circuit;

an amplification stage coupled to said second current mirror circuit and said input stage, said amplification stage operable to amplify a signal transmitted from said input stage; and an output stage coupled to said second current mirror circuit and said amplification stage, said output stage operable to output an amplified signal transmitted from said amplification stage.

2. The circuit of claim 1 wherein said initial current source comprises a first FET having a gate, a source and a drain, said gate of said first FET coupled to said source of said first FET and a predetermined voltage level and a drain of said first FET coupled to said current mirror circuit.

3. The circuit of claim 2, wherein said active resistive element comprises a second FET having a gate, a source and a drain, said gate and said source of said second FET coupled to said drain of said first FET.

4. The circuit of claim 3, wherein said second FET is constructed in a manner similar to said first FET such that said variance inducing factors acting on said first FET causing variations in said initial current will similarly act on said second FET, said second FET operable to counteract said variations in said initial current.

5. The circuit of claim 4, wherein said first and second FETS are solid-state components comprising semiconductor materials and wherein one of said variance inducing factors comprises variations in the operational characteristics of said components resulting from processes used to construct said components.

6. The circuit of claim 4, wherein one of said variance inducing factors comprises changes in the temperature of the environment within which the circuit is operating.

* * * * *